PRINTED CIRCUITRY LAMINATES AND PRODUCTION THEREOF

Filed May 3, 1955

2 Sheets-Sheet 1

INVENTOR.
CORNELIUS WERBERIG
BY
Ward, Neal, Haselton, Orme & McElhannon
ATTORNEYS.

Aug. 26, 1958 C. WERBERIG 2,849,298

PRINTED CIRCUITRY LAMINATES AND PRODUCTION THEREOF

Filed May 3, 1955 2 Sheets-Sheet 2

INVENTOR.
CORNELIUS WERBERIG
BY
Ward Neal Haselton Orme & McElhannon
ATTORNEYS.

United States Patent Office 2,849,298

Patented Aug. 26, 1958

2,849,298

PRINTED CIRCUITRY LAMINATES AND PRODUCTION THEREOF

Cornelius Werberig, Levittown, Pa., assignor to St. Regis Paper Company, New York, N. Y., a corporation of New York Application May 3, 1955, Serial No. 505,791

3 Claims. (Cl. 41—43)

This invention pertains to printed electrical circuitry and provides a novel process for applying electrical circuits or other metal patterns on one or both surfaces of plastic laminates.

Various methods have heretofore been employed for forming electrical circuits on one or both opposed surfaces of plastic or resinous laminates, all of which are, however, objectionable in various respects. One procedure employed is to press a sheet of copper foil, adhesively coated on one surface, against a preformed and cured resinous laminate. An electrical circuit is then printed with an acid resist on the exposed copper surface, and the unprinted area etched away with acid, following which the resist is removed. This technique has the disadvantages of involving a double pressing and handling operation, one to form the laminate and a second to apply the copper coating, while the resulting printed circuit is not flush with the surface of the laminate proper. The latter objection is overcome by pressing the copper foil onto a plastic laminate which has been initially hot pressed only to a semi-cured state. The copper surface is then resist printed, etched and repressed, to embed the resulting circuit in the laminate. However, the time, expense and handling involved in the double pressing is not eliminated. It has also been known to employ the adhesively coated copper foil as the surface sheet of a laminating build-up and thus to produce the copper foil coated laminate in a single hot pressing operation. But in this technique like all the preceding, the resist printing and etching must be carried out on the finished laminate, which is objectionable as involving the resist printing and etching of individual laminates, and as not productive of a flush circuit. These same objections apply to electroplating techniques involving conductive resist printing and electroplating operations carried out on preformed laminates.

Now I have devised a process according to which the electrical circuit or circuits are produced as a continuous and uninterrupted operation on thin and flexible sheet material fed continuously from a reel through the various forming steps to be ultimately sheared into lengths embodying the finished circuit, which lengths are then employed as surface sheets of laminating build-ups, subjected to a single hot pressing operation, thereby to produce finished and completely cured laminates embodying flush electrical circuits on one or both faces as required.

According to my process, copper or other suitable metal foil is fed continuously from a roll mounted on an uncoiling reel and has continuously applied to its undersurface a suitable adhesive coating which is then dried to form a self-supporting continuous firmly adhering insulating film. The opposite or uncoated surface of the copper foil is concurrently printed in any suitable manner with the electrical circuit or circuits to be reproduced, in the form of a resist. The unprinted portion of the copper foil is then etched away by passage of the so treated web through suitable etching and wash baths, whereby there remains only the self-supporting film as a continuous web, one surface of which has adhering thereto the residual or unetched copper foil in the form of a successive repetition of the electrical circuit or circuits to be reproduced. In this form the web is sheared into lengths embodying the circuit or circuits in question, which are thus employed as surface sheets of laminating build-ups as aforesaid and hot pressed into finished laminates.

Having thus described the invention in general terms, reference will now be had for a more detailed description, to the accompanying drawings wherein:

Figure 6 is an enlarged view in transverse section of a portion of the Figure 3 build-up, prior to hot pressing, while

Figures 1, 2:
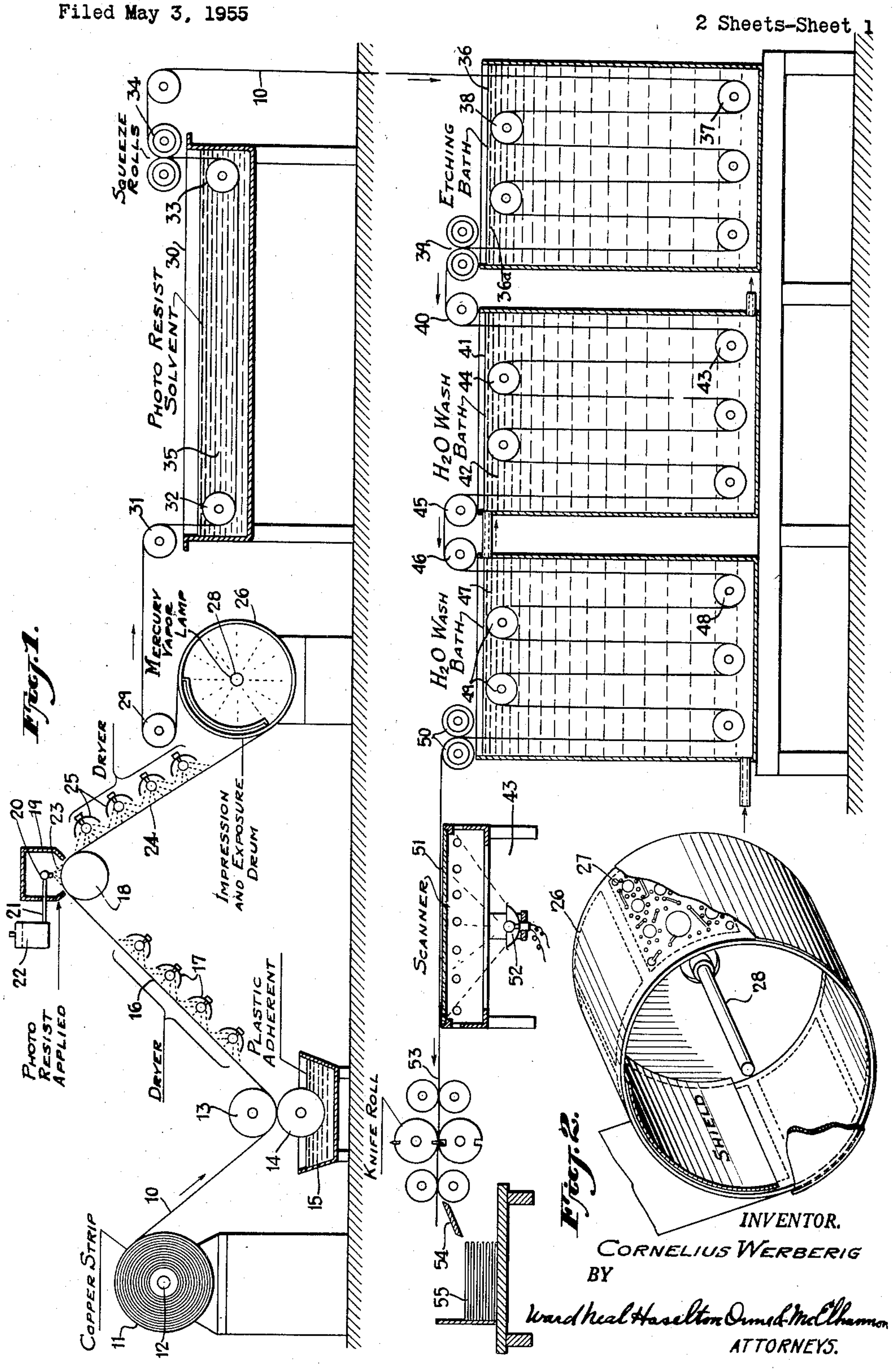
Figure 1 is a more or less diagrammatic or schematic showing in longitudinal sectional elevation, through a suitable form of apparatus, for practicing the invention in accordance with a preferred embodiment.
Figure 2 is an enlarged perspective view of a portion of the apparatus shown in Figure 1, employed in connection with the photo-electric printing of the electrical circuit or circuits on the copper foil.

Referring to Figs. 1 and 2, thin copper foil of about 1 to 3 ounces per square foot, in the form of continuous strip 10, is fed continuously from a roll 11 thereof, mounted on a shaft 12, and thence under and about a guide roll 13. Beneath the guide roll 13 is mounted a coating roll 14 which is partially submerged in a bath 15 of a suitable adhesive, such as an admixture of an alkylated phenolic formaldehyde thermosetting resin and a polyvinyl butyral thermo-plastic resin, in a suitable volatile solvent and thinner, such as acetone, methyl isobutyl ketone or other low boiling ketone. Preferred adhesives are those put out on copper foil by Rubber and Asbestos Company, of Bloomfield, New Jersey, under its designation Type "N" and Type "F." The rolls 13, 14 are so mounted as to press the copper foil 10 therebetween, and such that the roll 14 transfers a relatively thick coating of about 1.5–2 mils thick, of the adhesive from the bath 15 thereof thence onto the under side of the copper foil 10.

The so coated foil 10 passes thence upwardly as at 16 past a series of drying elements such as a bank of infra-red ray lamps 17, which volatilize the diluent constituents of the plastic adhesive and convert the same to a tough and self-supporting plastic film which adheres tenaciously to the copper foil. The so coated strip passes thence over and about a guide roll 18, above which is mounted a housing 19 in which is mounted a nozzle 20 connected over a pipe line 21 to a reservoir 22 filled with a photo-resist, whereby this resist is sprayed onto the upper or uncoated surface of the copper foil in the manner illustrated at 23. The so treated strip passes thence downwardly as at 24, past a bank of drying lamps 25, which dry the photo-resist applied to the upper surface of the copper foil.

The strip is fed thence about a drum 26 embodying light transmitting areas, as at 27, Fig. 2, corresponding to an electrical circuit or circuits to be reproduced on the photo-resist coated surface of the copper foil. For such purposes the drum 26 may be made, for example, of thin sheet metal, which has been blanked out in accordance with the electrical circuit pattern 27, or may be made of a clear plastic material coated with an opaque paint or adhesive except for the patterned areas. This drum is suitably mounted for rotation about its axis, and along its axis on the interior of the drum there extends a mercury arc or equivalent lamp 28, for producing a photographic image, corresponding to the patterned areas 27, on the photo-resist coating.

The strip as thus treated passes off the drum and about a guide roll 29 and thence into a tank 30 over and under guide rolls 31, 32 and thence out of this tank under and over guide rolls 33, 34. The tank 30 contains a solvent 35 for dissolving the areas of the photo-resist coating not sensitized by light. Thus as the strip passes out of this bath it embodies the electrical circuit patterned areas 27, comprising the light-sensitized photo-resist areas.

The strip passes out of the photo-resist wash tank 35 between guide rolls 34 and is fed thence into an etching tank 36 under and over guide rolls, as at 37, 38, wherein the strip is immersed in a ferric chloride etching bath **36*a*, consisting, for example, of a 40% aqueous solution of ferric chloride maintained substantially at room temperature. In this bath all portions of the copper strip are etched away except those protected by the photo-resist, imprinted in accordance with the electrical circuit pattern 27 of the drum 26**.

The so etched strip is fed thence out of tank 36 between squeegee rolls 39, and thence over a guide roll 40 into wash tank 41, filled with water 42, being fed therethrough under and over guide rolls 43, 44. The strip passes out of this tank over a guide roll 45 and thence over a guide roll 46 into and through a second water wash tank 47 under and over guide rolls 48, 49. In these tanks the etched strip is thoroughly washed to remove the etching solution, the strip passing out of this tank between squeegee rolls 50, from whence the strip is fed over an inspection unit 51, provided with a light source 52 directed upwardly through the etched strip as shown, for indicating any flaws in the pattern areas produced.

The strip is fed thence as at 53 through a cutting device which cuts the strip into lengths as at 54, corresponding to the pattern areas, the lengths so cut being deposited in stacked assembly in a suitable hopper as at 55.

A suitable photo-resist to be applied from the reservoir 22, is that put out by the Eastman Kodak Company, Rochester, New York, under that name, this resist when sensitized by light being resistant to all commonly used etchants. To be used with this resist for dissolving the unsensitized portions of the photo-resist is, for example, Eastman Kodak's Photo-resist Developer, to be employed in the bath 35, and wherein the non-light-sensitized areas are dissolved away by maintaining all portions of the strip therein for about two minutes at substantially room temperature. For producing the light sensitized image on the photo-resist, it should be exposed to the light source 28 through the patterned areas 27 of the drum 26 for about four minutes, employing a 35 ampere carbon arc lamp at a distance of about three feet, or equivalent light from a mercury arc lamp, such as 28.

It is to be understood, of course, that the plastic film applied to the under side of the copper strip need not be applied continuously, as from the bath 15, but may be initially applied to the strip in the form of a preformed continuous film. Likewise there may be substituted for the photo-resist spray 23 and the light source 28 and drum 26, a print roll for printing a suitable resist onto the upper surface of the copper strip in accordance with the printed circuitry to be produced. With such substitution the photo-resist solvent bath 35 would, of course, be omitted and the strip passed to a drying oven and then to the etching bath 36, and thence through the water wash tanks 41, 47, etc., as above described.

Figure 3:
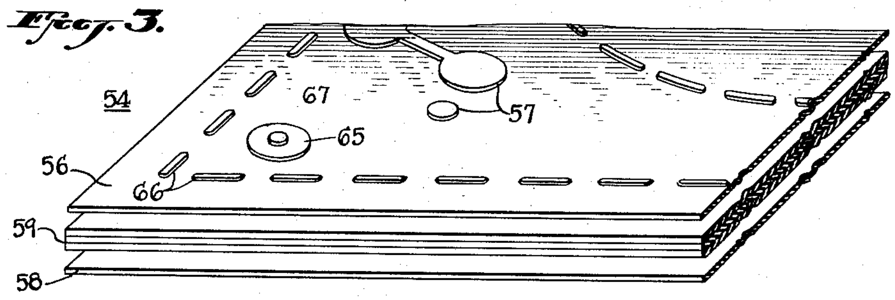
Figure 3 is a fragmentary perspective view of a laminating build-up employing the electrical circuit printed adhesive film obtained from the Figure 1 apparatus.

The cut lengths 54, Fig. 1, of the etched strip now have the appearance shown at 54 of Fig. 3, consisting of the self-supporting firmly adhering film 56 embodying on its upper surface the unetched pattern areas 57 consisting of copper foil. As shown in Fig. 3, the so etched sheet 54 is employed as the surface or liner sheet of a laminating assembly, the lower surface or liner sheet 58 of which may likewise constitute a similar sheet similarly produced but embodying a different electrical circuit pattern. Interposed between these two surface sheets is a stacked assembly of filler sheets 59, composed of a fibrous sheet material, such as kraft paper, impregnated with a thermosetting resin varnish, such as a phenol-formaldehyde resin varnish.

Figure 4:
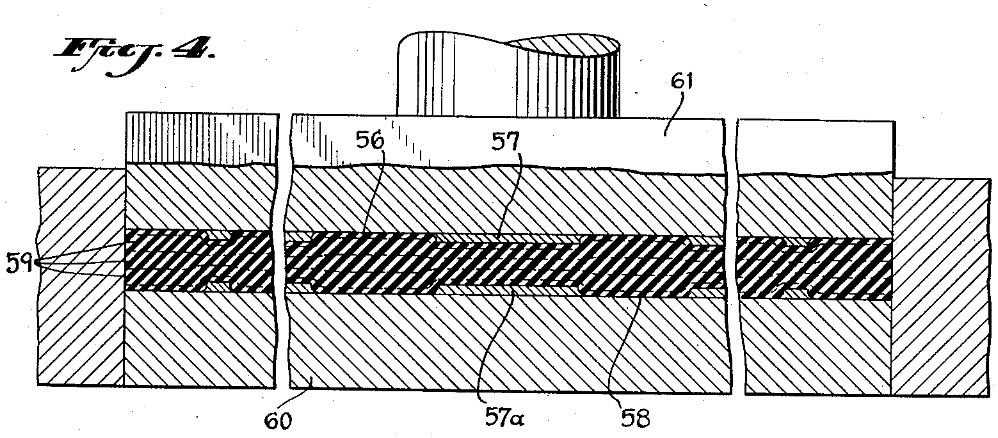
Figure 4 is a transverse section through a heated press and interposed laminating build-up, for hot pressing the build-up of Figure 3, and illustrating the embedding of the electrical circuit or circuits flush with the finished laminate.

For producing the finished laminate the stacked assembly of Fig. 3 is placed, referring now to Fig. 4, on the lower platen 60 of a heated press, having a co-acting upper platen 61, for hot pressing the stacked assembly in the manner shown. This hot pressing may appropriately be carried out at a pressure of about 1,000 pounds per square inch and at a temperature of about 335° F. for about 25 minutes. Following this the so pressed laminate is allowed to cool down in the press before the pressure is released. To prevent sticking of the liner sheets of the laminating build-up to the press platens as a result of the pressing operation, they are preferably, initially coated with a suitable lubricant, such, for example, as a silicone lubricant.

Figure 5:
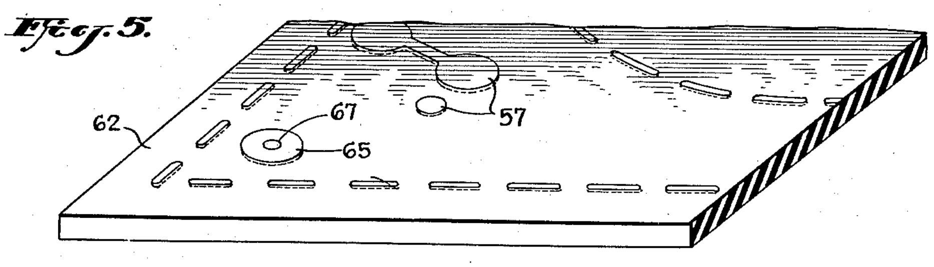
Figure 5 is a perspective view of a portion of the finished laminate resulting from the hot pressing operation of Figure 4.

As a result of the hot pressing operation of Fig. 4, a finished laminate 62 is produced as shown in Fig. 5, in which the individual laminae are consolidated into a unitary structure and the resin content thereof cured substantially to the thermoset condition.

Figure 6:
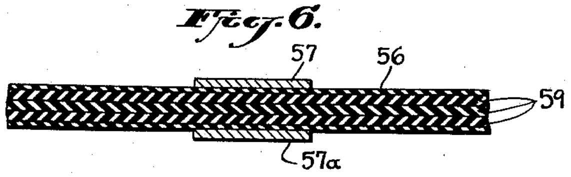
Figure 7:
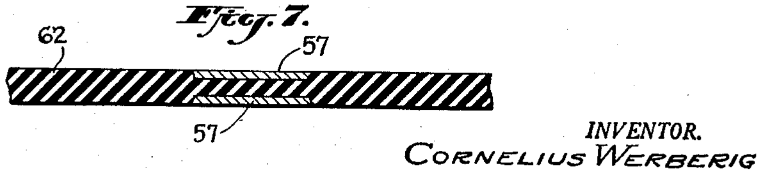
Figure 7 is a corresponding view subsequent to the hot pressing, illustrating the manner in which the electrical circuit is pressed flush with the surface of the laminate proper as a result of the hot pressing operation.

It will be seen, referring to Fig. 6, that prior to the hot pressing operation, the copper foil pattern 57 is disposed in upstanding relation on the film 56, whereas subsequent to the hot pressing operation, as shown in Fig. 7, the copper foil patterns 57, **57*a* are embedded in the laminate 62** proper with the upper surfaces of the foil substantially flush with the laminate surfaces. Thus as a result of this single hot pressing operation, a laminate is produced embodying on one or both faces, printed electrical circuits which are embedded and locked in the laminate in flush relation thereto.

For properly aligning the circuit patterns 57, **57*a* on the upper and lower surfaces of the laminates, respectively, the patterned areas include copper foil corner tabs, as at 65, Figs. 3 and 5, and copper foil border outlines as at 66. Upon assembling the laminating build-up, as in Fig. 3, the edges thereof are clamped together, as by stapling, and small holes punched through the build-up axially through the corner tabs, at at 67**, in which are inserted plastic aligning pins. After hot pressing the stapled edges of the laminate are sheared off.

What is claimed is:

1. A method of producing a thermoset resinous laminate having pattern areas of thin sheet metal embedded in at least one surface thereof, which comprises: applying to one surface of a thin sheet of metal a self-supporting, firmly adhering insulating film, resist printing the opposite surface of said metal sheet to define said pattern areas, removing the unprinted portion of said metal sheet by etching, leaving only said metal pattern on said film, superimposing said film, with said metal pattern exposed, onto a stacked assembly of sheets of fibrous material impregnated with a thermosetting resin, and hot pressing said assembly and superimposed film between platens to consolidate the same into a unitary, thermoset laminate having said metal pattern embedded flush with the laminate in a surface thereof.

2. A method for producing thermoset resinous laminates having pattern areas of thin sheet metal embedded in at least one surface thereof, which comprises: feeding a strip of metal in the direction of its length while progressively applying to one surface thereof a self-supporting, firmly adhering film of plastic material, and during said feeding repeatedly resist printing the opposite surface of said strip to define said pattern areas in longitudinally spaced relation, progressively feeding the so treated strip through an etching bath to remove the unprinted portion of said metal strip, thus to produce a web of said plastic film having said metal pattern areas adhering thereto, cutting said web into lengths corresponding to said successive pattern areas, superimposing a length of the film web so cut, with the metal pattern exposed, onto a stacked assembly of sheets of fibrous material impregnated with a thermosetting resin, and hot pressing said assembly and superimposed film length between platens to consolidate the same into a unitary, thermoset laminate having said metal pattern embedded flush with the laminate in a surface thereof.

3. A method for producing thermoset resinous laminates having pattern areas of thin sheet metal embedded in at least one surface thereof, which comprises: feeding a strip of thin sheet metal in the direction of its length while progressively applying to one surface thereof a self-supporting, firmly adhering film of plastic material, progressively applying to the opposite surface thereof a coating of a photo-sensitive resist, light sensitizing said photo-sensitive resist in accordance with said pattern areas at longitudinally spaced intervals along said strip, developing said light sensitized pattern areas of said resist, thereafter etching away all portions of said metal strip except the pattern areas covered by said resist, thus to produce a web of said plastic film having said metal pattern areas adhering thereto, cutting said film web into lengths corresponding to said successive pattern areas, superimposing a length of the film web so cut, with the metal pattern exposed, onto a stacked assembly of sheets of fibrous material impregnated with a thermosetting resin, and hot pressing said assembly and superimposed length of film between platens to consolidate the same into a unitary, thermoset laminate having said metal pattern embedded flush with the laminate in a surface thereof.

References Cited in the file of this patent

UNITED STATES PATENTS

| | | |
|---|---|---|
| 2,441,960 | Eisler | May 25, 1948 |
| 2,447,609 | Breece | Aug. 24, 1948 |
| 2,506,604 | Lokker et al. | May 9, 1950 |
| 2,692,190 | Pritikin | Oct. 19, 1954 |

OTHER REFERENCES

Printed Circuits, by Eisler (2), Journal of Brit. Inst. of Radio Engin., vol. XIII, No. 11, November 1953, page 523–541( see page 4).